United States Patent [19]
Kishi et al.

[11] Patent Number: 5,387,118
[45] Date of Patent: Feb. 7, 1995

[54] SOCKET FOR IC PACKAGE

[75] Inventors: Nobuaki Kishi; Makoto Hoshi; Tetsuya Osawa; Ichiro Matsuo, all of Saitama, Japan

[73] Assignee: Chichibu Fuji Co., Ltd., Satama, Japan

[21] Appl. No.: 103,756

[22] Filed: Aug. 10, 1993

[30] Foreign Application Priority Data

Apr. 30, 1993 [JP] Japan .................................. 5-104178
Jun. 28, 1993 [JP] Japan .................................. 5-157310

[51] Int. Cl.⁶ ............................................. H01R 13/62
[52] U.S. Cl. ..................................... 439/266; 439/331
[58] Field of Search ..................... 439/70, 71, 72, 73, 439/264, 265, 266, 268, 330, 331, 525, 526

[56] References Cited

U.S. PATENT DOCUMENTS

| | | |
|---|---|---|
| 3,710,299 | 1/1973 | Weisenburger . |
| 3,763,462 | 10/1973 | Ecker . |
| 4,077,688 | 3/1978 | Cobaugh et al. . |
| 4,148,537 | 4/1979 | Sochor . |
| 4,332,431 | 6/1982 | Bobb et al. . |
| 4,378,139 | 3/1983 | Griffin et al. .................. 439/331 |
| 4,461,525 | 7/1984 | Griffin . |
| 4,491,377 | 1/1985 | Pfaff . |
| 4,498,047 | 2/1985 | Hexamer et al. . |
| 4,533,192 | 8/1985 | Kelley . |
| 4,623,208 | 11/1986 | Kerul et al. . |
| 4,630,875 | 12/1986 | Korsunsky et al. . |
| 4,645,279 | 2/1987 | Grabbe et al. . |
| 4,691,975 | 9/1987 | Fukunaga et al. . |
| 4,715,823 | 12/1987 | Ezura et al. . |
| 5,020,998 | 6/1991 | Ikeya et al. .................. 439/330 X |
| 5,186,641 | 2/1993 | Uratsuji ....................... 439/331 X |
| 5,228,866 | 7/1993 | Espenshade et al. ........... 439/331 X |
| 5,244,404 | 9/1993 | Kishi et al. .................... 439/331 |
| 5,249,972 | 10/1993 | Walker ......................... 439/330 X |

FOREIGN PATENT DOCUMENTS 63-307678 12/1988 Japan .
4154065 5/1992 Japan .

OTHER PUBLICATIONS

Brearley et al., "Latchable Contact Card-To-Board Connector", IBM Technical Disclosure Bulletin, vol. 13, No. 9, Feb. 1971, p. 2590.
English language abstract of Japanese Patent Application No. 4-154065.
English language abstract of Japanese Patent Application No. 63-307678.

Primary Examiner—Khiem Nguyen
Attorney, Agent, or Firm—Sandler, Greenblum & Bernstein

[57] ABSTRACT

A socket for an IC package includes a base member having a receptacle space for the IC package, a plurality of contacts arranged in parallel along the sides of the receptacle space of the base member. The contacts each have a contact portion for contact with a corresponding lead of the IC package received in the receptacle space. A spring portion urges the contact portion inwardly to obtain a contact pressure against a lead. A connecting shaft is pivotally supported vertically along each row of the contacts, and is associated with the contacts. A cover covers the base member, and the connecting shaft pivots by depression of the cover to displace the contact portion of each contact outwardly away from the corresponding lead of the IC package against a biasing force of the spring portion. The contact has a curved, first spring portion extending upwardly and inwardly from an inside edge of a plate portion. A second spring portion is bent inwardly from a front end of the first spring portion and is contiguous to the contact portion, and a projection is formed on an upper surface of the second spring portion. The connecting portion has an engaging recess for engagement with the projection and also has an engaging face for engagement with the portion behind the projection. The cover includes inclined surface for allowing the movable cams to move pivotally outwardly.

5 Claims, 7 Drawing Sheets

SOCKET FOR IC PACKAGE

BACKGROUND OF THE INVENTION

The present invention relates to a socket for use in testing whether IC packages after fabrication are good or bad. More particularly, the present invention is concerned with a socket for IC package wherein a large number of contacts are arranged in parallel along the sides of a receptable space formed on a base member, the said contacts each having a contact portion for contact with a lead of an IC package received in the receptacle space and also having a spring portion for urging the contact portion inwards to obtain a contact pressure with respect to the lead of the IC package, and the said contact portion is displaced outwards away from the lead of the IC package against the biasing force of the said spring portion by depression of a cover which covers the base member.

Heretofore, as this type of sockets for IC package, there have been known a socket having levers, which is typified by the socket disclosed in Japanese Patent Laid Open No. 4-154065, and a direct-push type socket, which is typified by the socket disclosed in Japanese Patent Laid Open No. 63-307678.

Figure 9A:
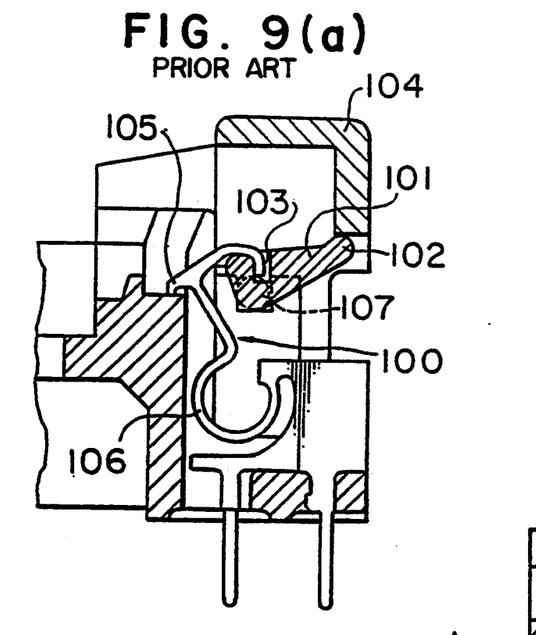
Figure 9B:
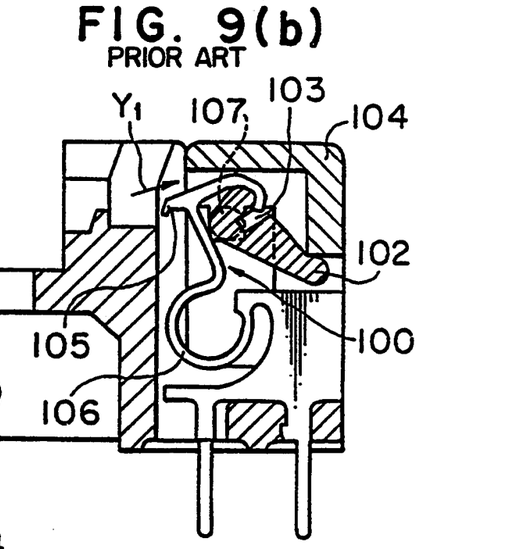
Figure 9C:
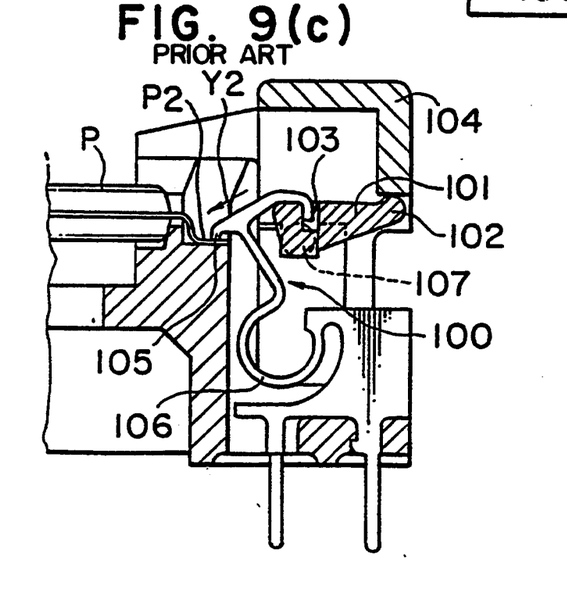

According to such conventional socket using levers, as shown in FIGS. 9(a), 9(b), 9(c), levers 101 are supported vertically pivotably along a row of contacts 100 which are arranged in a large number in parallel, an operating portion 102 is formed on one end side (outside) of each lever 101, while an engaging portion 103 is formed on the opposite end side (inside) of the lever, and the operating portion 102 is forced down by depression of a cover 104, whereby the lever 101 is moved pivotally downward and a contact portion 105 is displaced outward against the biasing force of a spring portion 106.

Figure 10:
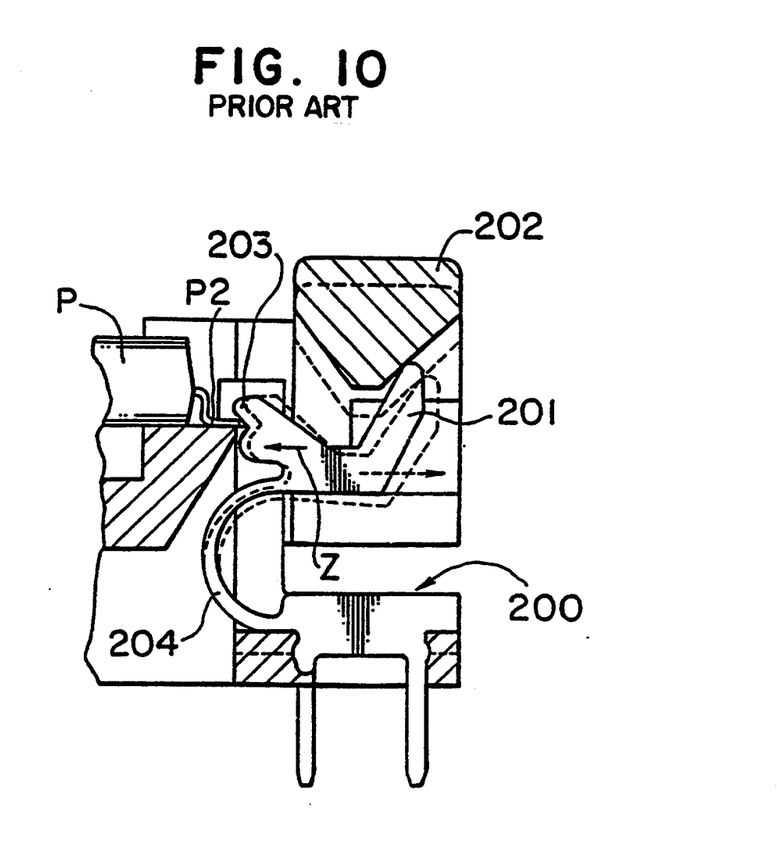
FIG. 10 is an enlarged sectional view of a principal portion of a conventional direct-push type socket.

According to the foregoing conventional, direct-push type socket, as shown in FIG. 10, an operating portion 201 is integrally formed outside each of contacts 200 which are arranged in a large number in parallel, and it is displaced outward by depression of a cover 202, thereby causing a contact portion 203 to be displaced outward against the biasing force of a spring portion 204.

According to the above conventional structures, the contact portions 105 (203) of the many contacts 100 (200) are displaced outward simultaneously by depression of the cover 104 (202), whereby the mounting and removal of an IC package P can be done in an unloaded condition. However, when the contact pressure of the contact portions 105 (203) against leads P2, the operating load and operation life in the depression of the cover 104 (202), and a sure holding performance for the IC package P, are studied in detail with respect to their technical contents, there still remain the following problems to be solved.

In the socket shown in FIGS. 9(a), 9(b), 9(c), since the spring portion 106 of each contact 100 is of such a shape as illustrated in the same figure and a fulcrum 107 of the lever 101 is a fixed point and the distance from the contact portion 105 is short, the contact portion 105 moves obliquely upward and substantially linearly toward the outside, as indicated by arrow Y1 in (b) of the same figure. In other words, the force for holding the IC package P acts in the direction indicated by arrow Y2 in (c) of the same figure, and thus it is somewhat uncertain whether it will be possible to hold the IC package P firmly.

In the socket shown in FIG. 10, since the contact portion 203 is displaced in the horizontal direction, the force for holding the IC package P acts in the direction of arrow Z in the same figure, so that there occurs poor contact caused by deformation or lateral displacement of the leads P2 of the IC package.

SUMMARY OF THE INVENTION

The present invention has been accomplished in view of the abovementioned circumstances and it is the object of the invention to provide a socket for IC package wherein contact portions of a large number of contacts are displaced outward simultaneously by depression of a cover to permit mounting and removal of an IC package and which is satisfactory in all of the contact pressure of the contact portions against leads of the IC package, the operating load and operation life in the depression of the cover and a sure holding performance for the IC package.

In the first aspect of the present invention, for achieving the above-mentioned object, there is provided a socket for IC package wherein a large number of contacts are arranged in parallel along the sides of a receptacle space formed on a base member, the said contacts each having a contact portion for contact with a lead of an IC package received in the receptacle space and also having a spring portion for urging the contact portion inward to obtain a contact pressure against the lead of the IC package; a connecting shaft supported vertically pivotably along the row of those contacts of the socket is associated with the socket contacts and is moved pivotally by depression of a cover which covers the base member, thereby causing the contact portions to be displaced outward away from the leads of the IC package against the biasing force of the spring portions; the contacts of the socket each having a first spring portion which extends upward and inward from an inner edge of a plate portion placed on the base member and is then bent outward and which is thus in a curved shape, a second spring portion which is bent inward from the front end of the first spring portion and is contiguous to the contact portion of the socket contact, and further having a projection projecting from the upper surface of the second spring portion; on the other hand, the connecting shaft has an engaging recess for engagement with the said projection and also has an engaging face for engagement with the portion behind the projection, the connecting shaft being pivotally supported at both ends thereof through elongated holes of movable cams which are supported pivotably on both right and left sides of the row of socket contacts; and the cover has an inclined surface for causing the movable cams to move pivotally outward.

In the second aspect of the present invention there is provided a socket for IC package wherein the pivotal fulcrum of each of the above movable cams is a second pivot shaft set on a line which perpendicularly intersects and bisects a line joining upper- and lower-limit positions in a pivoting path of each support portion of the connecting shaft drawn in the absence of the movable cam.

In the third aspect of the present invention there is provided a socket for IC package wherein a bearing hole substantially in the shape of true roundness is provided in place of the elongated hole formed in each of the foregoing movable cams, and the support portions at both ends of the connecting shaft are pivotally supported in the said bearing holes, further, the pivotal fulcrum of each movable cam is a third pivot shaft set in a position where a line which perpendicularly intersects and bisects a line joining upper- and lower-limit positions in a pivoting path of each support portion of the connecting shaft drawn in the absence of the movable cam, and a circular arc which passes through the central point of the above second pivot shaft with the said lower-limit position as the center, intersect each other.

Figure 1:
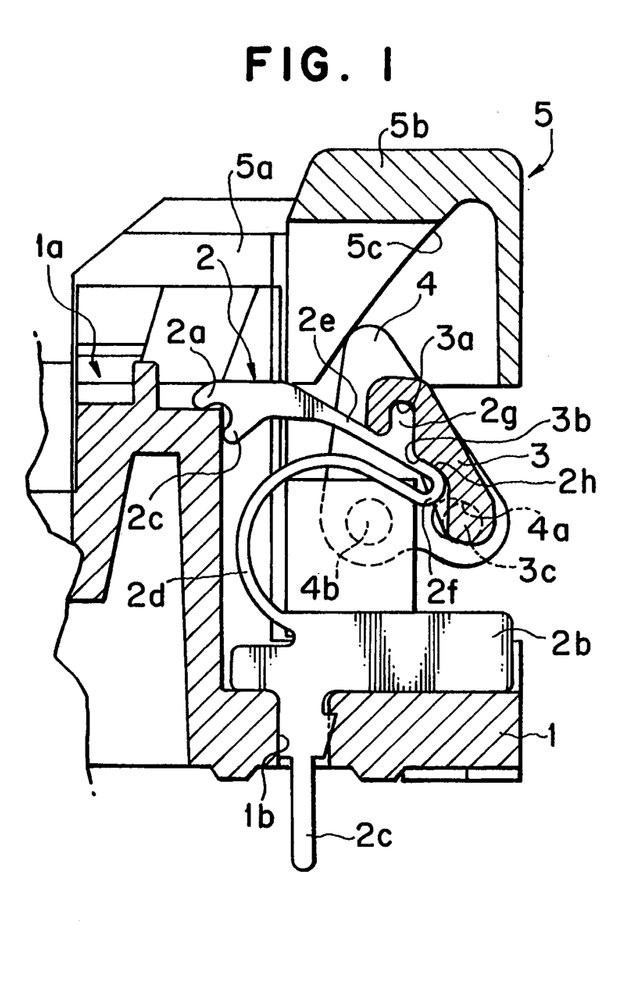
FIG. 1 is an enlarged sectional view of a principal portion of a socket for IC package according to an embodiment of the present invention.
Figure 3:
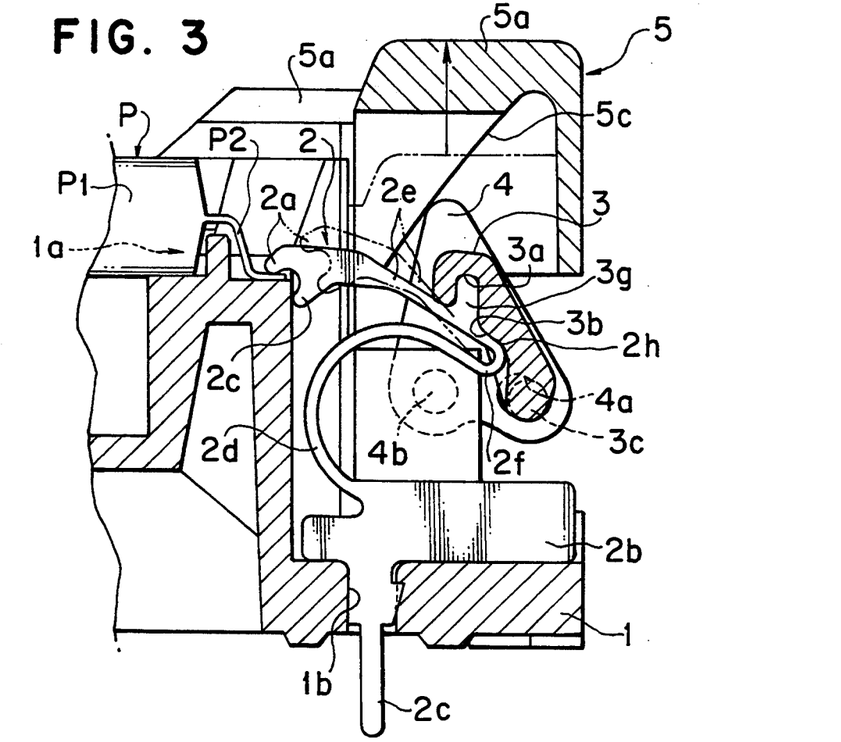
FIG. 3 is an enlarged sectional view of the principal portion, showing a loaded state of an IC package in the socket illustrated in FIG. 1.

According to the contact shape in the first aspect of the invention, the biasing force of the first spring portion and that of the second spring portion act in a depressing direction for the contact portion, so that a more certain holding performance for the IC package can be attained while the operating load and operation life in the depression of the contact cover are maintained at preset values (see FIGS. 1 and 3).

At the time of mounting or removal of the IC package, the movable cams are pivotally moved outward by depression of the cover and thereby push the support portions of the connecting shaft inserted into the elongated holes in a downward and inward direction, so that the connecting shaft pivotally moves downward and its engaging face pushes the portion behind the projection in a downward and inward direction, causing the first spring portion to be deformed into its contracted state. At the same time, the engaging recess of the connecting shaft pushes the projection of the second spring portion in a downward and outward direction and causes the second spring portion to move pivotally in an upward and outward direction, so that the contact portion of kite each contact of the socket is displaced outward against the biasing force of the spring portion. At the beginning of this displacement the contact portion rises substantially vertically and thereafter shifts obliquely outward away from the corresponding lead of the IC package, so that the foregoing holding performance can be obtained without the fear of deformation of the IC package leads (see FIGS. 2 and 4).

Moreover, since the pivotal fulcrum of each movable cam is set to the second pivot shaft described in the second aspect of the invention, the operation of the contact portion which rises substantially in the vertical direction at the beginning of its displacement and thereafter shifts obliquely outward, can be made more certain.

Further, in the case where the support portions of the connecting shaft are pivotally supported in bearing holes which are generally in the shape of true roundness and the pivotal fulcrum of each movable cam is set to the third pivot shaft described in the third aspect of the invention, although there is not obtained the foregoing displacement such that the contact portion rises vertically at the beginning of its displacement and thereafter shifts obliquely outward, there is obtained an operation of the contact portion having an angle closely akin to that of such displacement and which is sufficient to overcome the conventional drawbacks.

BRIEF DESCRIPTION OF THE DRAWINGS

FIGS. 9($a$), 9($b$) and 9($c$) are enlarged sectional views of a principal portion of a conventional socket having levers.

DETAILED DESCRIPTION OF THE PREFERRED EMBODIMENTS

Embodiments of the socket for IC package of the present invention will be described in detail hereinunder with reference to the accompanying drawings.

Embodiment I

Figure 4:
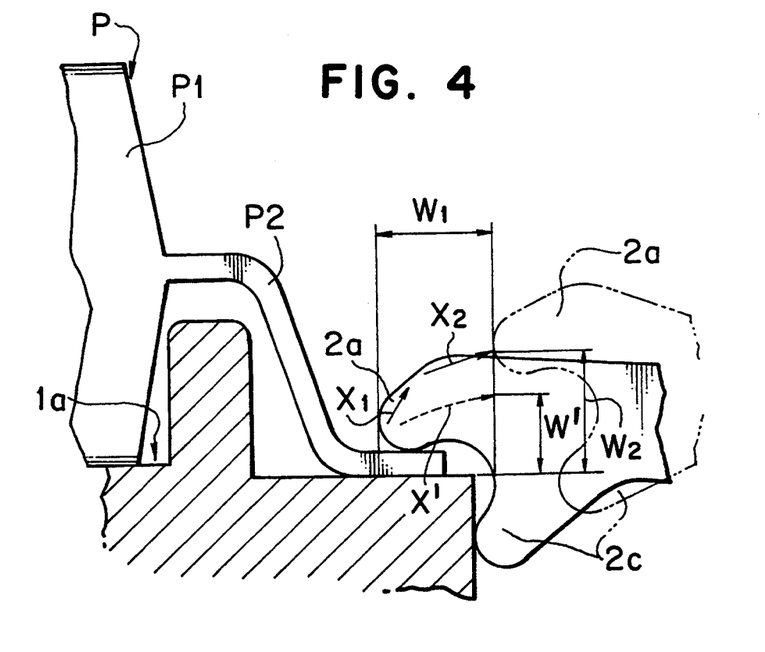
FIG. 4 is an enlarged view of a principal portion of FIG. 3.
Figure 5:
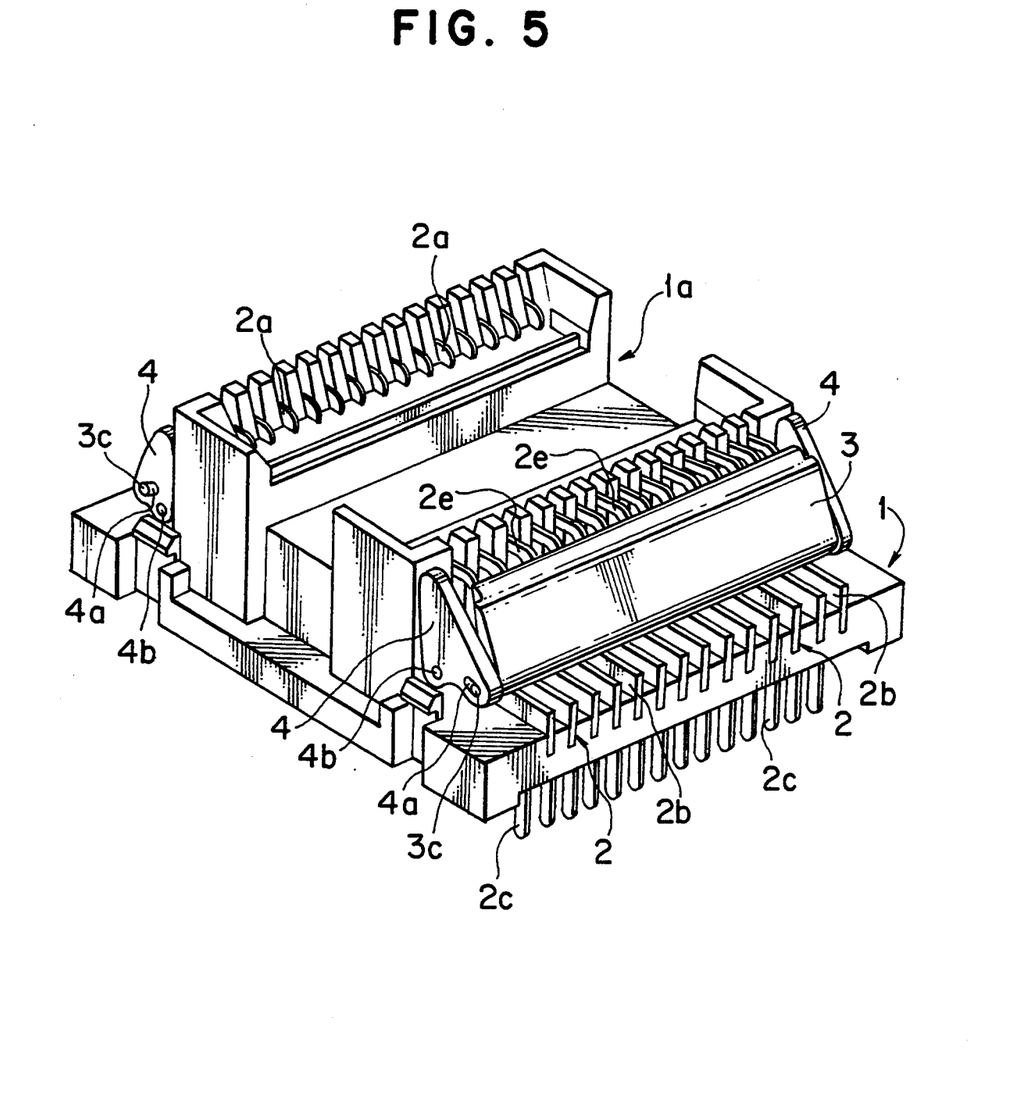
FIG. 5 is a perspective view of an appearance of the socket illustrated in FIG. 1, with a cover removed.
Figure 6:
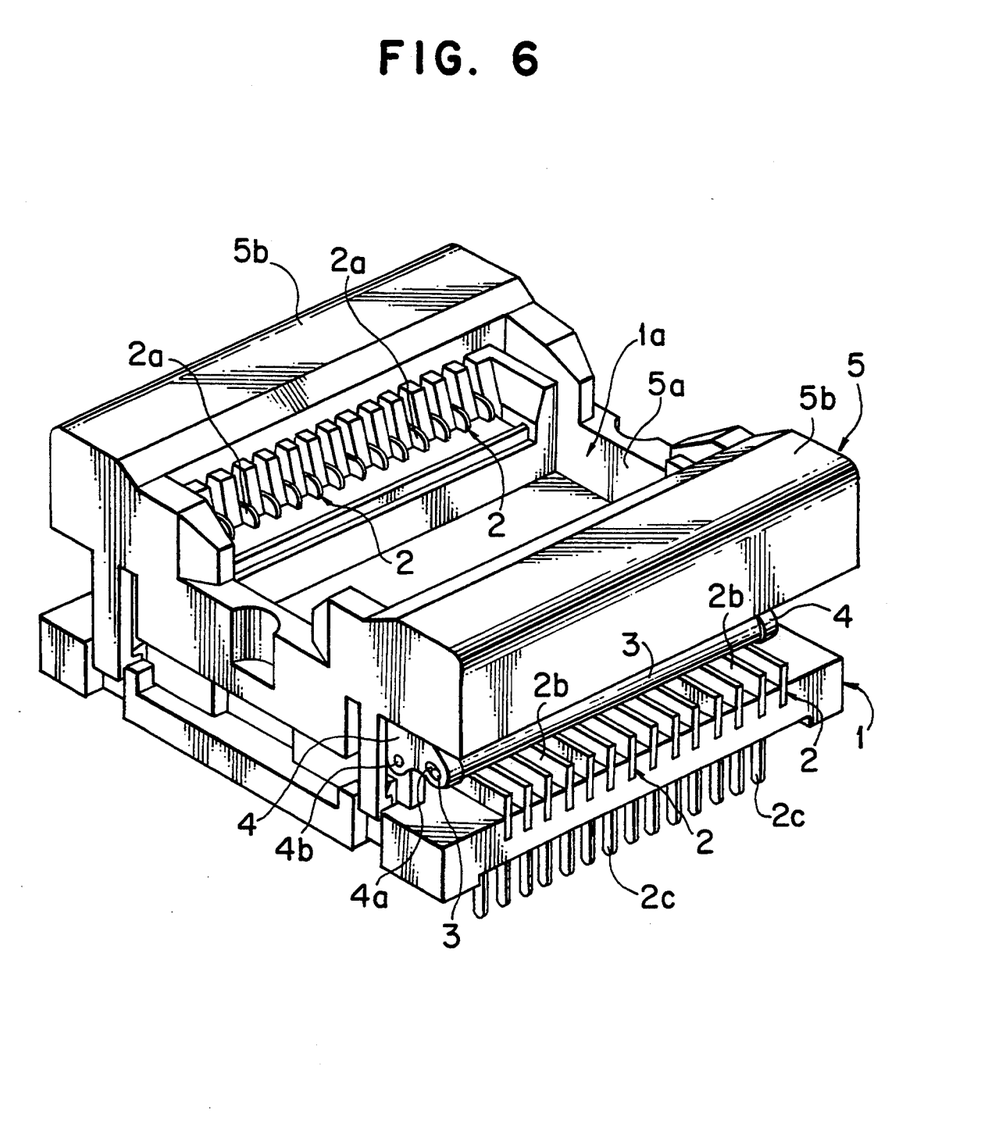
FIG. 6 is a perspective view of an appearance of the socket illustrated in FIG. 1.

FIGS. 1 to 6 illustrate an embodiment of the socket described above in the first aspect of the invention, of which FIGS. 1 to 4 are enlarged sectional views of principal portions, showing operating states, FIG. 5 is a perspective view of an appearance of the socket in an uncovered state, and FIG. 6 is a perspective view of an appearance of the socket with a cover mounted. In these figures, the numerals 1, 2, 3, 4 and 5 denote a base member, a contact, a connecting shaft, a movable cam and a cover, respectively.

The base member 1 is formed using an insulating material and is provided centrally with a protuberant portion which is rectangular in plan view. A recess is formed centrally of that protuberant portion and it is used as a receptacle portion 1$a$ for an IC package. A large number of contacts 2 are arranged in parallel along two opposed sides of the receptacle space 1$a$.

The contacts 2 are integrally formed in the shape illustrated in FIG. 1, using a desired electrically conductive material, in such a manner that each contact has a contact portion 2$a$ for contact with a lead P2 of the IC package received in the receptacle space 1$a$ and also has a spring portion for urging the contact portion 2$a$ inwards to obtain a contact pressure against the lead P2, which spring portion will be described later. A lower-end plate portion 2$b$ of the contact 2 is placed on the upper surface of the base member 1, and a terminal 2$c$ depending from the plate portion 2$b$ is inserted through a through-hole 1$b$ formed in the base member 1, whereby the plate portion 2$b$ is fixed in a vertically raised state on the base member 1.

The front end of the contact 2 is formed generally in C shape as illustrated in the drawing, and an upper end side thereof is formed as the contact portion 2$a$, while a lower end side 2$c$ thereof is allowed to function as a positioning stopper adapted to come into sliding contact with a side wall of the base member 1. The terminal 2$c$ located at the lower end of the contact 2 is inserted into a terminal insertion hole formed in a test circuit (not shown) and fixed by soldering for example.

The spring portion referred to above comprises a first spring portion 2d extending from an inside edge of the plate portion 2b in an upward and inward direction and then bent outward and which is thus curved, and a second spring portion 2e which is bent inward from the front end of the first spring portion 2d and is contiguous to the contact portion 2a. The contact portion 2a is urged downward by the resilience of both spring portions 2d and 2e, whereby the holding performance for the IC package P is further ensured while the contact pressure of the contact portion 2a against the lead P2, as well as the operating load and operation life in the depression of the cover 5, are maintained at predetermined values. A projection 2g is formed on the upper surface of the second spring portion 2e in a position close to a connection 2f with the first spring portion 2d.

A connecting shaft 3 is disposed along the row of the many contacts 2. The connecting shaft 3 has an engaging recess 3a for engagement with the projection 2g, the engaging recess 3a being formed in the underside of the connecting shaft on the upper end side. The connecting shaft 3 also has an engaging face 3b for engagement with the portion behind the said projection, as indicated at 2h as a projection rear part, in an intermediate position of the underside thereof which is contiguous to the engaging recess 3a. The connecting shaft 3 is further provided with support shafts 3c projecting from both right and left side faces thereof in lower end positions. The support shafts 3c are inserted pivotably into elongated holes 4a of the movable cams 4 to support the connecting shaft 3 vertically pivotably.

Each movable cam 4 has generally a triangular shape as illustrated in the drawing, and a pivot shaft 4b for the base member 1 is provided on the inner end side of its lower portion, while on the outer end side of its lower end portion there is formed the elongated hole 4a. The pivot shafts 4b of the movable cams 4 are supported by the base member 1 so that the movable cams are supported pivotably on both right and left sides of the row of the contacts 2. The elongated holes 4a (namely, pivoting fulcrums of the connecting shaft 3) are each formed in a position close to the connection 2f between the first and second spring portions 2d, 2e of each contact 2.

The cover 5 has a central opening 5a communicating with the receptacle space 1a, and in the portions thereof extending along the two opposed sides with respect to the opening 5a there are provided cover portions 5b which cover the row of the many contacts 2. Further, inside each cover portion 5b there are formed inwardly inclined surfaces 5c in right and left side end positions. The inclined surfaces 5a come into sliding contact with the upper ends of the movable cams 4 and thus the cover 5 is supported vertically while covering the base member 1 from above.

The connecting shaft 3, movable cams 4 and cover 5 are each integrally formed using an insulating material.

The IC package is a well-known structure, in which a large number of generally Z-bent leads P2 are arranged in parallel along side edges of a body P1 received in the receptacle space 1a.

According to the socket of this embodiment constructed as above, the resilience of the first and second spring portions 2d, 2e of each contact 2 acts in a downwardly pressing direction for the contact portion 2a, whereby a more certain holding performance for the IC package P is obtained while the contact pressure of the contact portion 2a against the lead P2, as well as the operating load and operation life in the depression of the cover 5, are maintained at predetermined levels (see FIG. 3).

Figure 2:
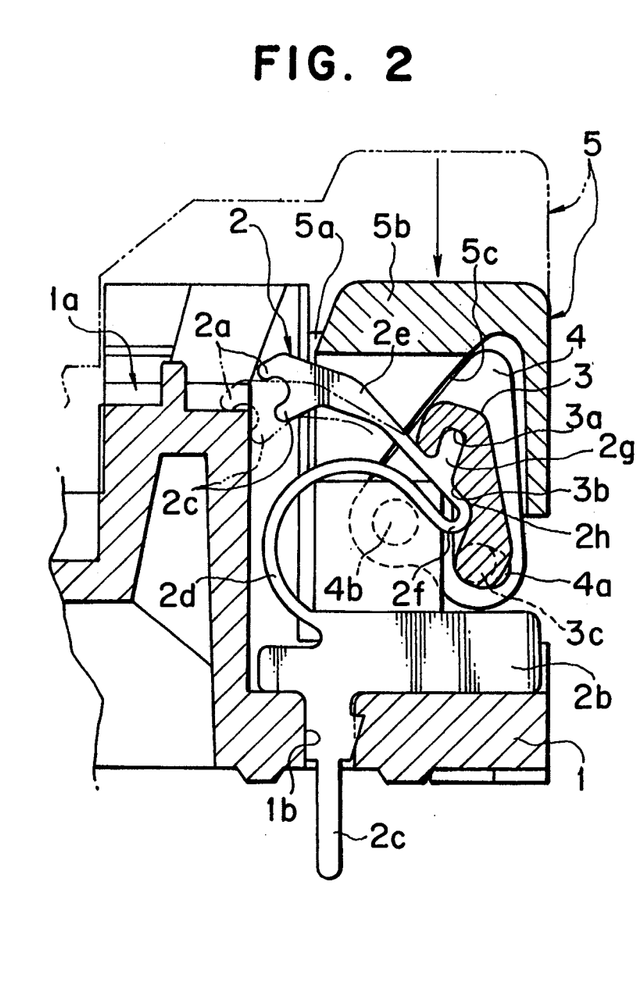
FIG. 2 is an enlarged sectional view of the principal portion, showing a stand-by state of the socket illustrated in FIG. 1.

At the time of mounting or removal of the IC package P, as shown in FIG. 2, each movable cam 4 is pivotally moved outward by depression of the cover 5 and causes the support shaft 3c inserted in the elongated hole 4a to be urged downwardly inwards, so that the connecting shaft 3 pivotally moves downward and its engaging face 3b pushes the projection rear part 2h downwardly inwards, thereby causing the first spring portion 2d to be contracted. At the same time, the engaging recess 3a pushes the projection 2g downwardly outward, causing the second spring portion 2e to move pivotally in an upward and outward direction, so that the contact portion 2a of the contact 2 is displaced outward against the resilience of the spring portion, thus permitting the mounting and removal of the IC package in an unloaded condition (see FIG. 2).

In this case, the pivoting fulcrums of the connecting shaft 3 are the elongated holes 4a, i.e. floating points, so at the beginning of displacement, the contact portion 2a rises nearly vertically as indicated by arrow X1 in FIG. 4, thereafter shifts obliquely outward away from the lead P2 of the IC package as indicated by arrow X2 in the same figure. The resulting amounts of displacement, W1 and W2, are larger in both length and height in comparison with the case where the pivoting fulcrums are fixed points (W'), so there is no fear of deformation of the IC package lead P2 and the foregoing holding performance is obtained.

Further, since each contact 2 is associated with the connecting shaft 3 through the engagement between the projection 2g and the engaging recess 3a and that between the projection rear part 2h and the engaging face 3b, even in the event the spring characteristic of any one of the contacts 2 is deteriorated, this deterioration is compensated by the spring characteristic of the entire row of the contacts, whereby incomplete contact with the leads P2 can be prevented.

Embodiment II

Figure 7:
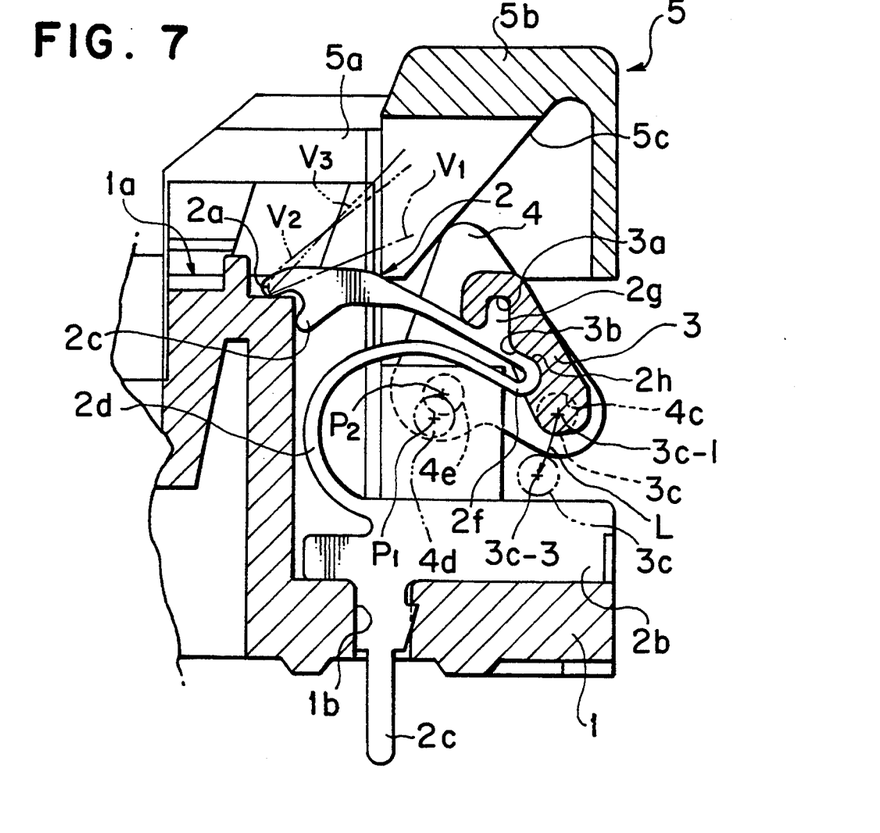
FIG. 7 is an enlarged sectional view of a principal portion of a socket for IC package according to another embodiment of the present invention.
Figure 8:
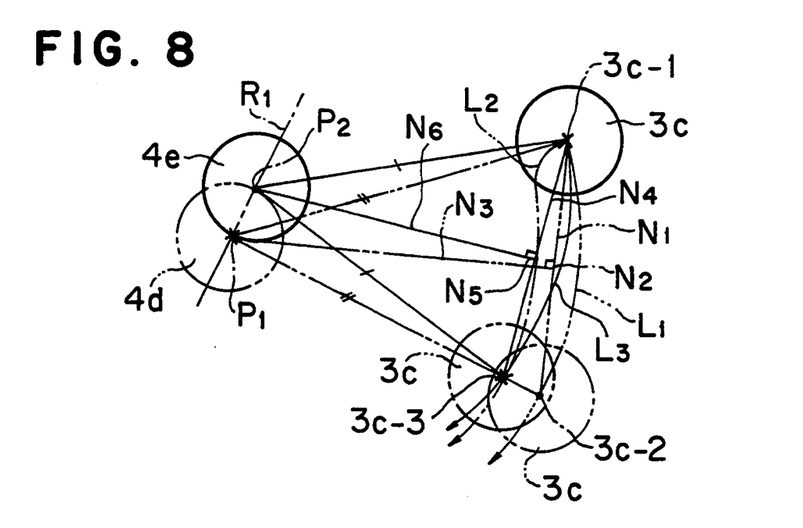
FIG. 8 is a schematic diagram explanatory of a set position of a second pivot shaft and that of a third pivot shaft.

The sockets described in the second and third aspects of the present invention are embodied in FIGS. 7 and 8.

The socket described in the second aspect of the invention is characterized in that as the pivoting fulcrum of each movable cam 4 in the above embodiment I there is used a second pivot shaft indicated at 4d in the drawings in place of the pivot shaft 4b explained above.

The socket described in the third aspect of the invention is characterized in that the supports shafts 3c in the previous embodiment I are each supported by a bearing hole which is generally in the shape of true roundness as indicated at 4c in FIG. 7 in place of the elongated hole 4a and that as the pivoting fulcrum of each movable cam 4 there is used a third pivot shaft indicated at 4e in the drawings in place of the pivot shaft 4b.

The constructions of the other portions than those just mentioned above in connection with the connecting shaft 3 and movable cam 4, as well as the constructions of base member 1, contacts 2 and cover 5, are almost the same as in the embodiment I, so these portions are indicated in the drawings by the same reference numerals as in the embodiment I and explanations thereof will be omitted.

Regarding in what positions the second and third pivot shafts 4d, 4e are to be set, the following detailed description is now provided with reference to FIGS. 7 and 8.

In these figures, the reference numeral L1 represents a moving path observed in the absence of the movable cams 4 in the embodiment I; numeral 3c-1 represents a central point of an upper-limit position of each support shaft 3c in the path L1; and numeral 3c-2 represents a central point of a lower-limit position of the support shaft 3c. In this case, the contact portion 2a is displaced as indicated by arrow V1 in FIG. 7, which is approximately the same as the direction of arrow X' shown in FIG. 4, so that there occurs the same inconvenience as in the prior art illustrated in FIGS. 9 and 10.

The upper-limit position of the support shaft 3c indicates the position (see FIGS. 1, 3 and 7) of the support shaft 3c prior to displacement of the contact portion 2a, while the lower-limit position of the support shaft 3c indicates the position (see FIG. 2) of the same shaft in maximum deformed states of the first and second spring portions 2d, 2e induced when the contact portion 2a is displaced by depression of the cover 5.

The second pivot shaft 4d was obtained as a result of having made further studies about the position of the pivot shaft 4b with a view to further ensuring the effect of the pivot shaft under the conditions of the previous embodiment I. For setting the pivot shaft 4d, a line N1 connecting two points on the path L1, namely the central points 3c-1 and 3c-2 of the upper- and lower-limit positions, respectively, is prepared and then the pivot shaft 4d is set on a line N3 passing through a point N2 which bisects the line N1 while intersecting the line N1 perpendicularly. L2 represents a moving path of each support shaft 3c obtained in the case where the pivot shaft 4d is used as a pivoting fulcrum of each movable cam and the other conditions are the same as in the embodiment I, and 3c-3 represents a central point of a lower-limit position of the support shaft 3c in the path L2. In this case, the contact portion 2a is displaced in the direction of arrow V2 in FIG. 7, which corresponds to the direction from X1 to X2 in FIG. 4, and thus the certainty of the displacement direction is improved, whereby the advantage of the embodiment I can be further ensured.

On the other hand, the third pivot shaft 4e is formed in a somewhat upper position with respect to the second pivot shaft 4d. More specifically, a line N4 connecting the central points 3c-1 and 3c-3 is prepared, and the third pivot shaft 4e is set in a position centered on a point of intersection P2 between a line N6 passing through a point N5 which bisects the line N4 while intersecting the line N4 perpendicularly and a circular arc R1 passing through the center P1 of the pivot shaft 4d with the central point 3c-3 as the center.

It goes without saying that, as shown in FIG. 8, the center P1 of the second pivot shaft 4d is at an equal distance from both the central points 3c-1 and 3c-2 and that the third pivot shaft 4e is at an equal distance from the central points 3c-1 and 3c-3.

In the embodiment wherein the pivot shaft 4e is used as a pivotal fulcrum of each movable cam 4 and the support shaft 3c is pivotally supported by the bearing hole 4c, the moving path of the support shaft 3c is an arcuate path which passes the lower-limit position 3c-3 through the inside of the path L1, as indicated at L3. In this case, the contact portion 2a is displaced in the direction of arrow V3 in FIG. 7. That is, although there is not obtained such a displacement as in the embodiment I wherein the contact portion 2a rises vertically at the beginning of displacement and thereafter moves obliquely outwards, there is obtained a displacement closely akin to the displacement direction V2. Consequently, while eliminating the fear of wobbling of the connecting shaft 3 in the case of pivotally supporting each support shaft 3c through the elongated hole, there can be obtained effects corresponding to the foregoing function and effects obtained in the embodiment I and sufficient to eliminate the drawback involved in the conventional displacement direction of arrow V1.

Since the socket for IC package of the present invention is constructed as above, the holding performance for the IC package is further ensured by urging the contact portion of each contact downwardly inwards. At the time of mounting or removal of the IC package, the contact portion first rises nearly vertically and thereafter shifts obliquely outward away from the corresponding lead of the IC package, so that the above holding performance for the IC package can be obtained without the fear of deformation of the package lead.

Thus, there can be provided a socket for IC package wherein the contact portions of many contacts are simultaneously displaced outward by depression of a cover, thereby permitting mounting and removal of the IC package in an unloaded condition, and which exhibits superior effects in all of the contact pressure of contact portions against the leads of the package, the operating load and operation life in the cover depressing operation, and an ensured holding performance for the IC package.

Moreover, by setting the pivotal fulcrum of each movable cam to the second pivot shaft as described in the second aspect of the invention, it is made possible to further ensure the motion of each contact portion which rises nearly vertically at the beginning of its displacement and thereafter shifts obliquely upward, whereby the above effects can be rendered more outstanding.

Further, in the case where each support shaft is pivotally supported by a bearing hole which is substantially in the shape of true roundness and the pivotal fulcrum of each movable cam is set to the third pivot shaft, there is obtained effects corresponding to the foregoing function and effects obtained in the use of the socket described in the first aspect of the invention and sufficient to eliminate the drawback involved in the conventional displacement direction, while eliminating the fear of wobbling of the connecting shaft in the case of supporting the support shaft by the elongated hole. Thus, there can be attained various advantages.

What is claimed is:

1. A socket for an IC package, including:
    a base member having a receptacle space for the IC package;
    a plurality of contacts arranged in parallel rows along the sides of said receptacle space of the base member, each of said contacts having a contact portion for contact with a corresponding lead of the IC package received in said receptacle space, and a spring for urging said contact portion inwardly to obtain a contact pressure against said lead;
    a connecting shaft supported vertically and pivotally along each row of the contacts; and
    a cover mounted to cover said base member,
    said connecting shaft being moved pivotally by depression of said cover to displace the contact portion of each said contact outwards away from the corresponding lead of the IC package against a biasing force of said spring, each spring having a curved, first spring portion extending upwardly and inwardly from an inside edge of a plate portion placed on said base member and is bent outwardly, a second spring portion being bent inwardly from a front end of the first spring portion and contiguous to said contact portion, and a projection formed on an upper surface of the second spring portion, said connecting shaft having an engaging recess for engagement with said projection and an engaging face for engagement with an area of said second spring portion behind said projection, said connecting shaft further having support shafts at both ends thereof, said support shafts being pivotally supported by elongated holes formed in movable cams, said movable cams being pivotally supported on both right and left sides of each row of the contacts, and said cover having an inclined surface for allowing said movable cams to move pivotally outwardly.

2. A socket for an IC package according to claim 1, wherein a pivotal fulcrum of each said movable cam is a second pivot shaft, said second pivot shaft being set on a line which perpendicularly intersects and bisects a line connecting a central point of an upper-limit position and that of a lower-limit position in a moving path of each said support shaft.

3. A socket for an IC package, including:

a base member having a receptacle space for the IC package;

a plurality of contacts arranged in parallel rows along the sides of said receptacle space of the base member, each of said contacts having a contact portion for contact with a corresponding lead of the IC package received in said receptacle space, and a spring for urging said contact portion inwardly to obtain a contact pressure against said lead;

a connecting shaft supported vertically and pivotally along each row of the contacts; and a cover mounted to cover said base member, said connecting shaft being moved pivotally by depression of said cover to displace the contact portion of each said contact outwards away from the corresponding lead of the IC package against a biasing force of said spring;

each spring having a curved, first spring portion extending upwardly and inwardly from an inside edge of a plate portion placed on said base member and is bent outwardly, a second spring portion being bent inwardly from a front end of the first spring portion and contiguous to said contact portion, and a projection formed on an upper surface of the second spring portion;

said connecting shaft having an engaging recess for engagement with said projection and an engaging face for engagement with an area of said second spring portion behind said projection, said connecting shaft further having support shafts at both ends thereof, said support shafts being pivotally supported by bearing holes formed in movable cams, said movable cams being pivotally supported on both right and left sides of each row of the contacts, wherein said bearing holes are generally in the shape of a true circle and are formed in said movable cams, and the support shafts provided at both ends of said connecting shaft are pivotally supported by said bearing holes, and wherein a pivotal fulcrum of each said movable cam is a third pivot shaft, said third pivot shaft being set in a position where a line which perpendicularly intersects and bisects a line connecting upper- and lower-limit positions in a moving path of each said support shaft and a circular arc with said lower-limit position as the center, intersect each other; and said cover having an inclined surface for allowing said movable cams to move pivotally outwardly.

4. A socket for an IC package, including:

a base member having a receptacle space for the IC package;

a plurality of contacts arranged in parallel rows along the sides of said receptacle space of the base member, each of said contacts having a contact portion for contact with a corresponding lead of the IC package received in said receptacle space, and a spring for urging said contact portion inwardly to obtain a contact pressure against said lead;

a connecting shaft supported vertically and pivotally along each row of the contacts; and a cover mounted to cover said base member, said connecting shaft being moved pivotally by depression of said cover to displace the contact portion of each said contact outwards away from the corresponding lead of the IC package against a biasing force of said spring;

each spring having a first spring portion extending from said base member and bent outwardly, a second spring portion being bent inwardly from a front end of the first spring portion and contiguous to said contact portion, and a projection formed on the second spring portion;

movable cams being pivotally supported on both right and left sides of each row of the contacts, said connecting shaft having an engaging recess for engagement with said projection, said connecting shaft further having support shafts at both ends thereof, said support shafts being pivotally supported by bearing holes formed in said movable cams; and said cover having an inclined surface for contacting said movable cams and allowing said movable cams to move pivotally outwardly, whereby said connecting shaft moves downwardly to move said projection downwardly and outwardly so that each said contact moves outwardly and upwardly.

5. A socket for an IC package according to claim 4, wherein said first spring portion extends upwardly and inwardly from an inside edge of a plate portion placed on said base member and is bent outwardly, said second spring portion being bent inwardly from a front end of the first spring portion, and said projection being formed on an upper surface of the second spring portion.

* * * * *